(12) United States Patent  
Iwakiri et al.

(10) Patent No.: US 11,187,817 B2
(45) Date of Patent: Nov. 30, 2021

(54) RADIATION DETECTOR, RADIOGRAPHY APPARATUS, AND METHOD FOR MANUFACTURING RADIATION DETECTOR

(71) Applicant: FUJIFILM Corporation, Tokyo (JP)

(72) Inventors: Naoto Iwakiri, Kanagawa (JP); Haruyasu Nakatsugawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/992,177

(22) Filed: Aug. 13, 2020

(65) Prior Publication Data

US 2020/0371258 A1 Nov. 26, 2020

Related U.S. Application Data

(63) Continuation of application No. PCT/JP2019/005334, filed on Feb. 14, 2019.

(30) Foreign Application Priority Data

Feb. 28, 2018 (JP) .............................. JP2018-034555

(51) Int. Cl.
*G01T 1/20* (2006.01)
*H04N 5/33* (2006.01)

(52) U.S. Cl.
CPC .............. *G01T 1/2006* (2013.01); *H04N 5/33* (2013.01)

(58) Field of Classification Search
CPC ..... G01T 1/2006; G01T 1/20189; H04N 5/33; H01L 27/14625; H01L 27/14601; H01L 27/14609; H01L 27/14658
See application file for complete search history.

(56) References Cited

U.S. PATENT DOCUMENTS

| 4,511,802 | A | 4/1985 | Teraoka | |
|---|---|---|---|---|
| 2003/0031296 | A1 | 2/2003 | Hoheisel | |
| 2003/0075688 | A1 | 4/2003 | Fukui | |
| 2004/0169149 | A1* | 9/2004 | Alzner | G03B 42/08 250/484.4 |
| 2006/0067462 | A1* | 3/2006 | Hack | A61B 6/145 378/38 |

(Continued)

FOREIGN PATENT DOCUMENTS

| JP | S58-204400 A | 11/1983 |
|---|---|---|
| JP | H11-223891 A | 8/1999 |

(Continued)

OTHER PUBLICATIONS

International Search Report issued in PCT/JP2019/005334; dated May 14, 2019.

(Continued)

*Primary Examiner* — Kiho Kim
(74) *Attorney, Agent, or Firm* — Studebaker & Brackett PC

(57) ABSTRACT

A radiation detector includes a substrate having flexibility, a plurality of pixels which are provided on a surface of the substrate and each of which includes a photoelectric conversion element, and a scintillator that is stacked on the substrate and has a plurality of corners. An outer edge of each of the corners of the scintillator is disposed closer to the inside of the substrate than an extension line of each of sides sharing the corner.

12 Claims, 10 Drawing Sheets

(56) References Cited

U.S. PATENT DOCUMENTS

| | | | | |
|---|---|---|---|---|
| 2010/0141820 A1* | 6/2010 | Chenebaux | ............ | H04N 5/374 |
| | | | | 348/302 |
| 2012/0168632 A1 | 7/2012 | Yagi et al. | | |
| 2014/0301527 A1* | 10/2014 | Morimoto | ............ | G01N 23/046 |
| | | | | 378/4 |
| 2018/0064405 A1* | 3/2018 | Miller | .................... | A61B 6/145 |

FOREIGN PATENT DOCUMENTS

| | | | |
|---|---|---|---|
| JP | 2003-070776 A | 3/2003 |
| JP | 2003-075594 A | 3/2003 |
| JP | 2010-101722 A | 5/2010 |
| JP | 2010-261720 A | 11/2010 |
| JP | 2011-247881 A | 12/2011 |
| JP | 2012-141242 A | 7/2012 |
| JP | 2015-004560 A | 1/2015 |
| JP | 2015-064284 A | 4/2015 |

OTHER PUBLICATIONS

Written Opinion issued in PCT/JP2019/005334; dated May 14, 2019.
An Office Action; "Notice of Reasons for Refusal," mailed by the Japanese Patent Office dated Jul. 6, 2021, which corresponds to Japanese Patent Application No. 2020-502935 and is related to U.S. Appl. No. 16/992,177 with English translation.

\* cited by examiner

US 11,187,817 B2

RADIATION DETECTOR, RADIOGRAPHY APPARATUS, AND METHOD FOR MANUFACTURING RADIATION DETECTOR

CROSS-REFERENCE TO RELATED APPLICATIONS

This application is a continuation application of International Application No. PCT/JP2019/005334 filed Feb. 14, 2019, the disclosure of which is incorporated herein by reference in its entirety. Further, this application is based on and claims priority under 35 USC 119 from Japanese Patent Application No. 2018-034555 filed on Feb. 28, 2018, the disclosure of which is incorporated herein by reference in its entirety.

BACKGROUND

Technical Field

The technology of the present disclosure relates to a radiation detector, a radiography apparatus, and a method for manufacturing a radiation detector.

Related Art

The following technology has been known as a technology related to a radiography apparatus. For example, JP2015-064284A (Patent Document 1) discloses a radiographic image detection device comprising: a scintillator that has a scintillator main body having a polygonal plate shape and a protruding portion protruding outward from at least one corner of the scintillator main body and converts radiation into visible light; a substrate that supports the scintillator; and a scintillator protective film that covers the surfaces of the scintillator main body and the protruding portion and has a peripheral portion closely attached to the substrate.

In contrast, JP2003-075594A (Patent Document 2) discloses a radiation image conversion panel characterized in that at least a phosphor layer is accommodated in an enclosed space formed by two sheet-shaped rigid bodies and a frame body provided between the two sheet-shaped rigid bodies and the inner corner of the frame body has a curved shape or a polygonal shape in which each angle is equal to or greater than 90 degrees.

As a radiation detector used in a radiography apparatus, a radiation detector has been known that includes a substrate, a plurality of pixels which are provided on a surface of the substrate and each of which includes a photoelectric conversion element, and a scintillator stacked on the substrate. In recent years, a flexible material, such as a resin film, has been used as a material of a substrate forming the radiation detector. In a case in which the substrate has flexibility, the corner of the scintillator has a smaller contact area with the substrate than other portions of the scintillator. Therefore, the corner is likely to peel off.

SUMMARY

An object of the technology of the present disclosure is to reduce the risk of a scintillator peeling off from a substrate, as compared to a case in which the outer edge of each corner of a scintillator is disposed on an extension line of each of sides sharing the corner or is disposed closer to the outside of the substrate than the extension line.

According to a first aspect of the technology of the present disclosure, there is provided a radiation detector comprising: a substrate having flexibility; a plurality of pixels which are provided on a surface of the substrate and each of which includes a photoelectric conversion element; and a scintillator that is stacked on the substrate and has a plurality of corners. An outer edge of each of the corners of the scintillator is disposed closer to an inside of the substrate than an extension line of each of sides sharing the corner.

According to a seventh aspect of the technology of the present disclosure, there is provided a method for manufacturing a radiation detector. The method comprises: a step of forming a plurality of pixels each of which includes a photoelectric conversion element on a surface of a substrate having flexibility; and a step of stacking a scintillator which has a plurality of corners and in which an outer edge of each of the corners is disposed closer to an inside of the substrate than an extension line of each of sides sharing the corner.

DETAILED DESCRIPTION

Figure 1:
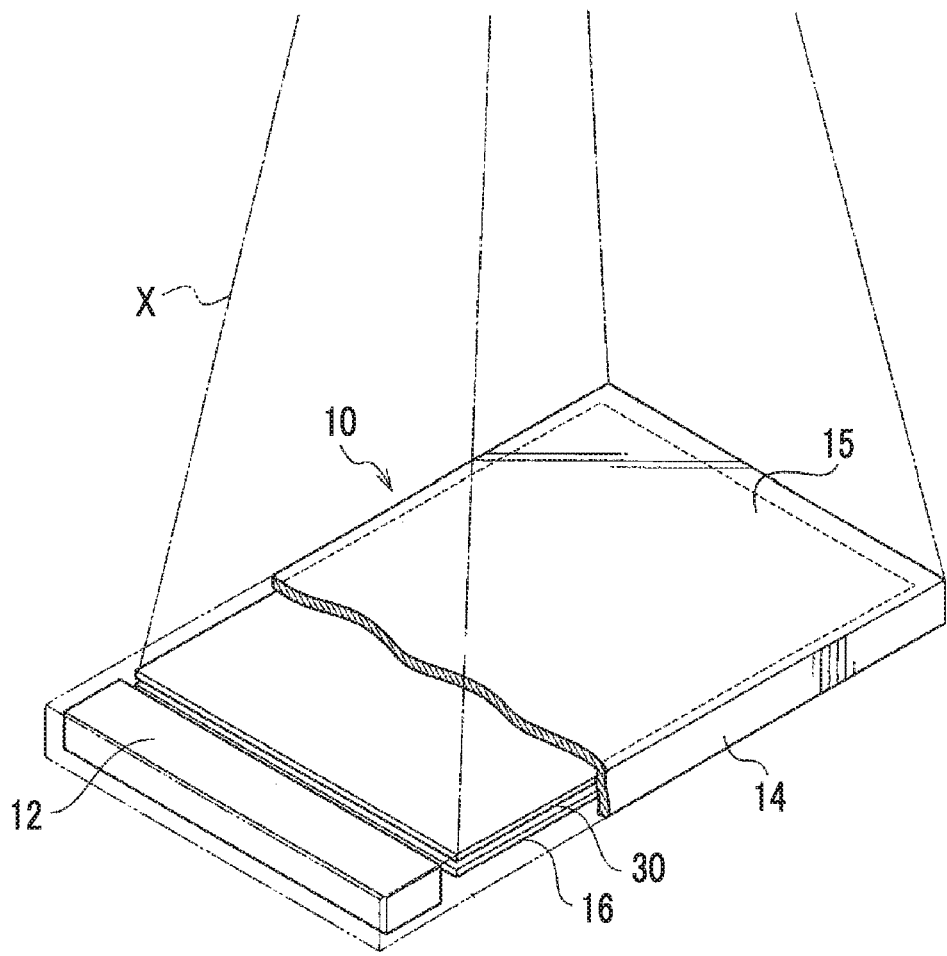
FIG. 1 is a perspective view illustrating an example of a configuration of a radiography apparatus according to an embodiment of the technology of the present disclosure.

Hereinafter, an example of an embodiment of the technology of the present disclosure will be described with reference to the drawings. In the drawings, the same or equivalent components and portions are denoted by the same reference numerals.

FIG. 1 is a perspective view illustrating an example of a configuration of a radiography apparatus 10 according to an embodiment of the technology of the present disclosure. The radiography apparatus 10 has the form of a portable electronic cassette. The radiography apparatus 10 includes a radiation detector 30 (flat panel detector (FPD)), a control unit 12, a support plate 16, and a housing 14 that accommodates the radiation detector 30, the control unit 12, and the support plate 16.

For example, the housing 14 has a monocoque structure made of a carbon fiber reinforced resin (carbon fiber) that has high transparency to radiation, such as X-rays, a light weight, and high durability. An upper surface of the housing 14 is a radiation incident surface 15 on which radiation that has been emitted from a radiation source (not illustrated) and transmitted through a subject (not illustrated) is incident. In the housing 14, the radiation detector 30 and the support plate 16 are disposed in order from the radiation incident surface 15.

The support plate 16 supports a circuit substrate 19 (see FIG. 2) on which an integrated circuit chip for performing, for example, signal processing is mounted and is fixed to the housing 14. The control unit 12 is disposed at an end in the housing 14. The control unit 12 includes a battery (not illustrated) and a controller 29 (see FIG. 5).

Figure 2:
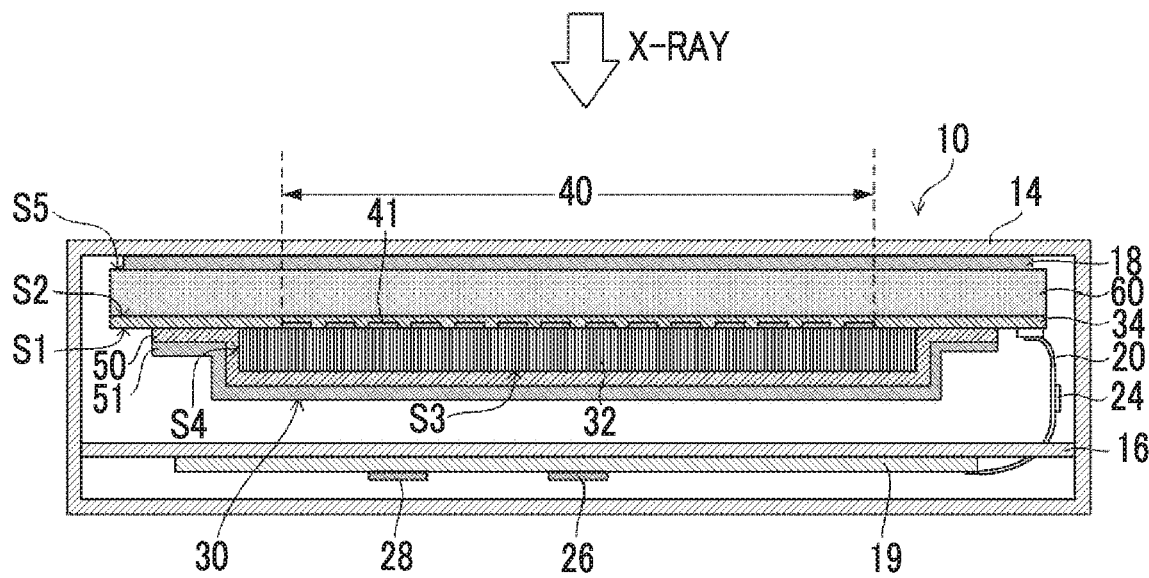
FIG. 2 is a cross-sectional view illustrating an example of the configuration of the radiography apparatus according to the embodiment of the technology of the present disclosure.

FIG. 2 is a cross-sectional view illustrating an example of the configuration of the radiography apparatus 10. The radiation detector 30 includes a substrate 34 having flexibility, a plurality of pixels 41 which are provided on a surface of the substrate 34 and each of which includes a photoelectric conversion element 36 (see FIG. 5), a scintillator 32 that is stacked on the substrate 34, and a support member 60 that supports the substrate 34.

The substrate 34 is a flexible substrate having flexibility. In the specification, the flexibility of the substrate 34 means that, in a case in which one of four sides of the substrate 34 having a rectangular shape is fixed, the height of a portion of the substrate 34 which is 10 cm away from the fixed side of the substrate 34 is less than the height of the fixed side by 2 mm or more. For example, a resin substrate, a metal foil substrate, or a thin glass having a thickness of about 0.1 mm can be used as the substrate 34. In particular, it is preferable to use a resin film, such as Xenomax (registered trademark) which is a high heat-resistant polyimide film, as the substrate 34. Each of the plurality of pixels 41 is provided on a first surface S1 of the substrate 34.

The scintillator 32 is stacked on the first surface S1 of the substrate 34. The scintillator 32 includes a phosphor that converts the emitted radiation into light. The scintillator 32 is configured by, for example, an aggregate of columnar crystals including thallium-activated cesium iodide (CsI:Tl). The columnar crystal of CsI:Tl can be directly formed on the substrate 34 by, for example, a vapor growth method. The columnar crystal of CsI:Tl formed on a substrate different from the substrate 34 may be attached to the substrate 34. In addition, the scintillator 32 can be made of terbium-activated gadolinium oxysulfide ($Gd_2O_2S$:Tb). Each of the photoelectric conversion elements 36 (see FIG. 5) forming the plurality of pixels 41 generates charge on the basis of light emitted from the scintillator 32. In the specification, an area in which the plurality of pixels 41 are provided on the substrate 34 is referred to as an active area 40.

A surface S3 of the scintillator 32 which is opposite to a contact surface with the substrate 34 and a surface S4 intersecting the surface S3 are covered with a reflective film 50. The reflective film 50 has a function of reflecting the light emitted from the scintillator 32 to the substrate 34. The reflective film 50 can be made of, for example, $Al_2O_3$. The reflective film 50 covers the surfaces S3 and S4 of the scintillator 32 and also covers the substrate 34 in the periphery of the scintillator 32. In a case in which the radiography apparatus 10 can obtain a radiographic image with desired quality without providing the reflective film 50, the reflective film 50 can be omitted.

The surface of the reflective film 50 is covered with a sealing film 51. The sealing film 51 covers the surfaces S3 and S4 of the scintillator 32 through the reflective film 50 and also covers the substrate 34 at the periphery of the scintillator 32. The sealing film 51 has a moisture-proof function of sealing the scintillator 32 to prevent moisture from being penetrated into the scintillator 32. The sealing film 51 can be made of a resin, such as polyethylene terephthalate, polyphenylene sulfide, or polyethylene naphthalate.

In this embodiment, the radiography apparatus 10 adopts an imaging method using irradiation side sampling (ISS) in which the substrate 34 is disposed on the radiation incident side. The adoption of the irradiation side sampling makes it possible to reduce the distance between a strong emission position of the scintillator 32 and the pixel 41, as compared to a case in which penetration side sampling (PSS) in which the scintillator 32 is disposed on the radiation incident side is adopted. As a result, it is possible to increase the resolution of a radiographic image. The radiography apparatus 10 may adopt the penetration side sampling.

The support plate 16 is disposed on the side of the scintillator 32 which is opposite to the radiation incident side. A gap is provided between the support plate 16 and the scintillator 32. The support plate 16 is fixed to the side of the housing 14. The circuit substrate 19 is provided on a surface of the support plate 16 which is opposite to the scintillator 32. For example, a signal processing unit 26 that generates image data and an image memory 28 that stores the image data generated by the signal processing unit 26 are mounted on the circuit substrate 19.

The circuit substrate 19 and the substrate 34 are electrically connected to each other through wires printed on a flexible printed circuit (FPC), a tape carrier package (TCP), or a chip-on-film (COF) 20. A charge amplifier 24 that converts charge read out from the pixel 41 into an electric signal is mounted on the COF 20. A gate line driving unit 22 (see FIG. 5) is mounted on another flexible printed circuit (not illustrated in FIG. 2) that electrically connects the circuit substrate 19 and the substrate 34.

The support member 60 is stacked on a second surface S2 of the substrate 34 which is opposite to the first surface S1.

The support member 60 has a function of giving the substrate 34 rigidity necessary for the substrate 34 to support the scintillator 32. That is, in a case in which the support member 60 is provided, the warpage of the substrate 34 caused by the weight of the scintillator 32 is suppressed, as compared to a case in which the support member 60 is not provided.

The support member 60 can be made of a resin, such as polyphenylene sulfide (PPS), polyarylate (PAR), polysulfone (PSF), polyether sulfone (PES), polyetherimide (PEI), polyamideimide (PAI), polyether ether ketone (PEEK), a phenol resin, polytetrafluoroethylene, polychlorotrifluoroethylene, a silicone resin, polyethylene terephthalate (PET), polyethylene naphthalate (PEN), or polycarbonate. Further, the support member 60 may be made of metal such as aluminum, iron, or an alloy thereof. Furthermore, the support member 60 may be made of a stacked material obtained by stacking a resin and metal. A surface S5 of the support member 60 which is opposite to a contact surface with the substrate 34 is attached to the inner wall of the housing 14 through an adhesive layer 18.

Figure 3:
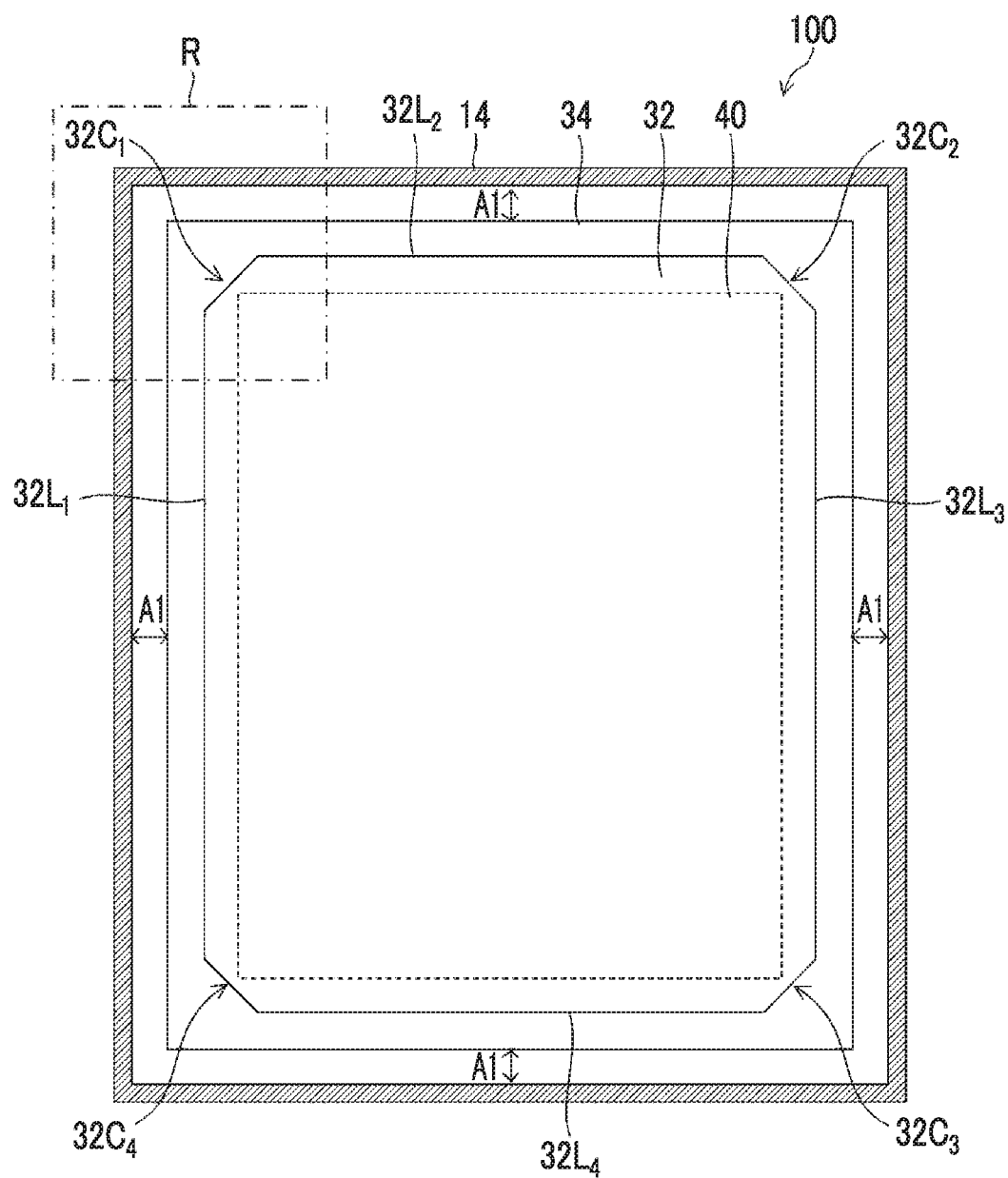
FIG. 3 is a plan view illustrating an example of the configuration of the radiography apparatus according to the embodiment of the technology of the present disclosure.

FIG. 3 is a plan view illustrating an example of the positional relationship among the housing 14, the substrate 34, the active area 40, and the scintillator 32, and the outer shapes thereof.

The outer shapes of the housing 14 and the substrate 34 are, for example, a rectangle. The substrate 34 is accommodated in the housing 14 with a clearance A1 between the substrate 34 and the housing 14. That is, a gap is provided between each side of the substrate 34 and the inner wall of the housing 14. Therefore, for example, even in a case in which the radiography apparatus 10 is dropped, an impact is applied to the radiography apparatus 10, and the housing 14 is deformed, it is possible to suppress the risk that the substrate 34 and each member mounted on the substrate 34 will be damaged.

The entire active area 40 of the substrate 34 is covered by the scintillator 32. That is, the scintillator 32 covers each of the plurality of pixels 41. The size of the scintillator 32 is smaller than the size of the substrate 34. The entire scintillator 32 comes into contact with the substrate 34. In this embodiment, the scintillator 32 has four corners $32C_1$, $32C_2$, $32C_3$, and $32C_4$ and four sides $32L_1$, $32L_2$, $32L_3$, and $32L_4$. The sides $32L_1$ and $32L_2$ share the corner $32C_1$. The sides $32L_2$ and $32L_3$ share the corner $32C_2$. The sides $32L_3$ and $32L_4$ share the corner $32C_3$. The sides $32L_4$ and $32L_1$ share the corner $32C_4$. The sharing of the corner $32C_1$ by the side $32L_1$ and the side $32L_2$ means that the side $32L_1$ is connected to one end of the corner $32C_1$ and the side $32L_2$ is connected to the other end of the corner $32C_1$. This holds for the other corners $32C_2$ to $32C_4$.

Figure 4:
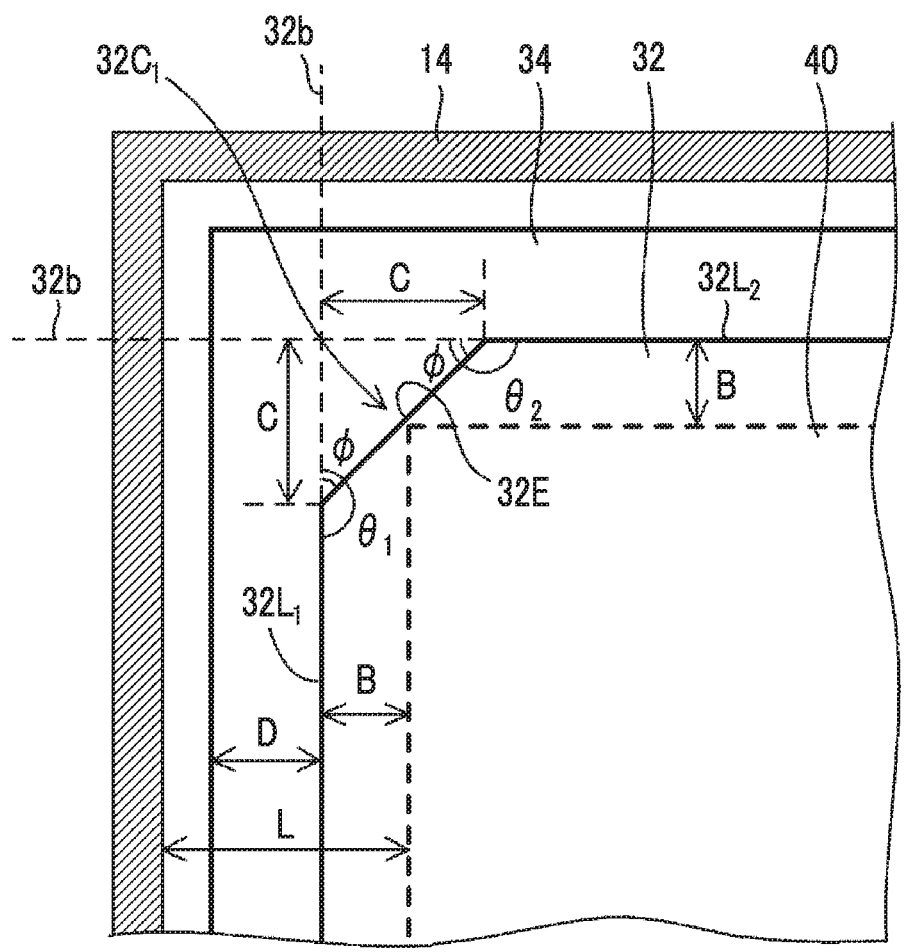
FIG. 4 is an enlarged view illustrating a region surrounded by a one-dot chain line in FIG. 3.

Here, FIG. 4 is an enlarged view illustrating an area R around the corner $32C_1$ that is surrounded by a one-dot chain line in FIG. 3. Hereinafter, the corner $32C_1$ will be described. However, this holds for the other corners $32C_2$, $32C_3$, and $32C_4$. The corner $32C_1$ of the scintillator 32 is chamfered and an outer edge 32E of the corner $32C_1$ of the scintillator 32 is disposed closer to the inside (center) of the substrate 34 than an extension line 32b of the side $32L_1$ and the side $32L_2$ sharing the corner $32C_1$. In other words, the outer edge 32E of the corner $32C_1$ of the scintillator 32 is disposed at a position that is retracted from the extension line 32b of the side $32L_1$ and the side $32L_2$ sharing the corner $32C_1$. The outer edge 32E of the corner $32C_1$ is an edge of the scintillator 32 which is connected to the side $32L_1$ and the side $32L_2$ sharing the corner $32C_1$ and is bent or curved with respect to the side $32L_1$ and the side $32L_2$. This holds for the corners $32C_2$, $32C_3$, and $32C_4$ other than the corner $32C_1$ illustrated in FIG. 4.

The chamfering of the scintillator 32 means removing the apex of each of the corners $32C_1$ to $32C_4$ of the scintillator 32 to form an edged surface or a curved surface at each of the corners $32C_1$ to $32C_4$. The angle φ of the chamfer at each of the corners $32C_1$ to $32C_4$ of the scintillator 32 (that is, the angle between the outer edge 32E of each of the corners $32C_1$ to $32C_4$ and the extension line 32b) is typically 45°. However, the present disclosure is not limited thereto. Each of the corners $32C_1$ to $32C_4$ of the scintillator 32 can be chamfered such that the angles θ1 and θ2 of bent portions at each of the corners $32C_1$ to $32C_4$ of the scintillator 32 are obtuse angles.

In a case in which the distance between the end of the active area 40 and the corresponding side of the scintillator 32 is B and the chamfer dimension of the scintillator 32 is C, it is preferable that the following Expression (1) is satisfied. In a case in which the following Expression (1) is satisfied, the entire active area 40 can be covered with the scintillator 32 even though the corners $32C_1$ to $32C_4$ of the scintillator are chamfered.

$$C < 2B \quad (1)$$

In a case in which the distance between each of the sides $32L_1$ to $32L_4$ of the scintillator 32 and the corresponding side of the substrate 34 is D and the distance between the end of the active area 40 and the housing 14 is L, it is preferable that the following Expression (2) is satisfied. The following Expression (2) means that the clearance between the substrate 34 and the housing 14 is greater than zero. In addition, Expression (3) can be derived from Expressions (1) and (2).

$$L - B - D > 0 \quad (2)$$

$$C < 2B < 2(L-D) \quad (3)$$

Figure 5:
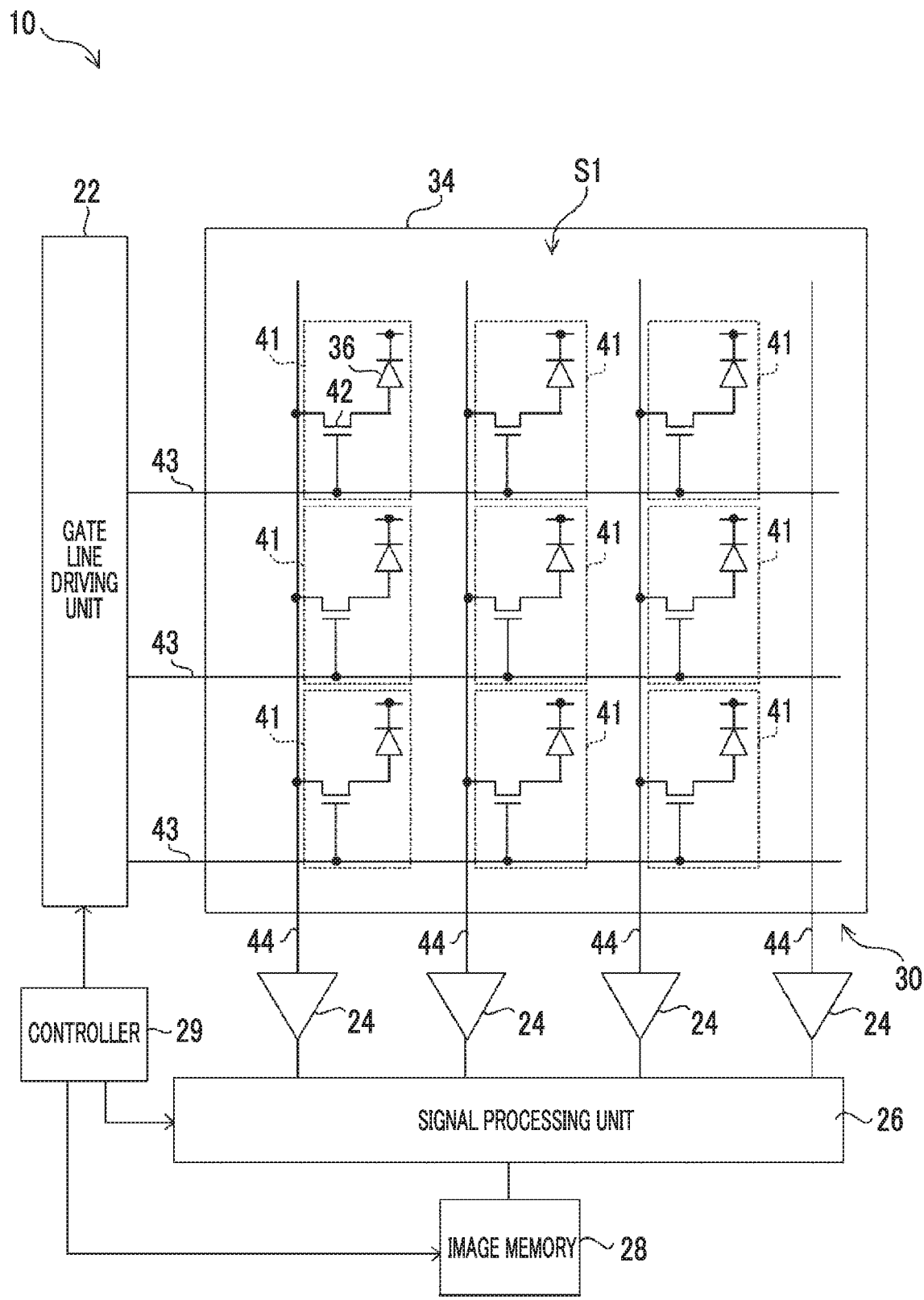
FIG. 5 is a diagram illustrating an example of an electrical configuration of the radiography apparatus according to the embodiment of the technology of the present disclosure.

FIG. 5 is a diagram illustrating an example of an electrical configuration of the radiography apparatus 10. The plurality of pixels 41 are arranged in a matrix on the first surface S1 of the substrate 34. Each of the pixels 41 includes the photoelectric conversion element 36 that generates charge on the basis of light emitted from the scintillator 32 and a thin film transistor (TFT) 42 as a switching element that is turned on in a case in which the charge generated in the photoelectric conversion element 36 is read out. The photoelectric conversion element 36 may be, for example, a photodiode made of amorphous silicon.

Gate lines 43 that extend in one direction (row direction) along the arrangement of the pixels 41, and signal lines 44 that extend in a direction (column direction) intersecting with the direction in which the gate lines 43 extend are provided on the first surface S1 of the substrate 34. Each of the pixels 41 is provided so as to correspond to each intersection portion of the gate line 43 and the signal line 44.

Each of the gate lines 43 is connected to the gate line driving unit 22. The gate line driving unit 22 reads out the charge accumulated in the pixels 41 on the basis of a control signal supplied from the controller 29. Each of the signal lines 44 is connected to the charge amplifier 24. The charge amplifier 24 is provided so as to correspond to each of the plurality of signal lines 44. The charge amplifier 24 generates an electric signal on the basis of the charge read out from the pixel 41. An output terminal of the charge amplifier 24 is connected to the signal processing unit 26. The signal processing unit 26 performs a predetermined process for the electric signal supplied from the charge amplifier 24 on the basis of a control signal supplied from the controller 29 to generate image data. The image memory 28 is connected to the signal processing unit 26. The image memory 28 stores the image data generated by the signal processing unit 26 on the basis of the control signal supplied from the controller 29.

The controller 29 communicates with a console (not illustrated) connected to the radiation source through a wired or wireless communication unit (not illustrated) to control the gate line driving unit 22, the signal processing unit 26, and the image memory 28, thereby controlling the operation of the radiography apparatus 10. The controller 29 may be configured to include, for example, a microcomputer. The gate line driving unit 22 is an example of a reading unit in the technology of the present disclosure. The signal processing unit 26 is an example of a generation unit in the technology of the present disclosure.

Hereinafter, an example of the operation of the radiography apparatus 10 will be described. In a case in which radiation that has been emitted from the radiation source (not illustrated) and transmitted through the subject is incident on the radiation incident surface 15 of the radiography apparatus 10, the scintillator 32 absorbs the radiation and emits visible light. The photoelectric conversion element 36 forming the pixel 41 converts the light emitted from the scintillator 32 into charge. The charge generated by the photoelectric conversion element 36 is accumulated in the corresponding pixel 41. The amount of charge generated by the photoelectric conversion element 36 is reflected on the value of the corresponding pixel 41.

In a case in which a radiographic image is generated, the gate line driving unit 22 supplies a gate signal to the TFT 42 through the gate line 43 on the basis of a control signal supplied from the controller 29. Each row of the TFTs 42 is turned on by the gate signal. In a case in which the TFT 42 is turned on, the charge accumulated in the pixel 41 is read out to the signal line 44 and is then supplied to the charge amplifier 24. The charge amplifier 24 generates an electric signal on the basis of the charge read out to the signal line 44 and supplies the electric signal to the signal processing unit 26.

The signal processing unit 26 comprises a plurality of sample-and-hold circuits, a multiplexer, and an analog-to-digital converter (which are not illustrated). The plurality of sample-and-hold circuits are provided so as to correspond to the plurality of signal lines 44, respectively. The electric signal supplied from the charge amplifier 24 is held by the sample-and-hold circuit. The electric signal held by each sample-and-hold circuit is input to the analog-to-digital converter through the multiplexer and is converted into a digital signal. The signal processing unit 26 generates data in which the digital signal generated by the analog-to-digital converter is associated with the positional information of the pixel 41 as image data and supplies the image data to the image memory 28. The image memory 28 stores the image data generated by the signal processing unit 26.

Hereinafter, a method for manufacturing the radiation detector 30 will be described. FIGS. 6A to 6E are cross-sectional views illustrating an example of the method for manufacturing the radiation detector 30.

Figure 6A:
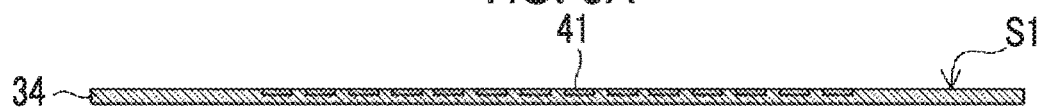
FIG. 6A is a cross-sectional view illustrating an example of a method for manufacturing a radiation detector according to the embodiment of the technology of the present disclosure.

First, the plurality of pixels 41 are formed on the first surface S1 of the substrate 34 (FIG. 6A). The pixels 41 may be formed in a state in which the substrate 34 is supported by a support (not illustrated) for supporting the substrate 34.

Figure 6B:
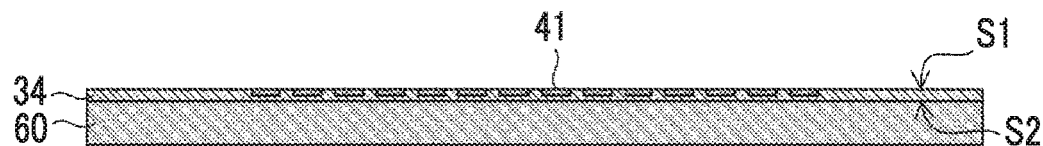
FIG. 6B is a cross-sectional view illustrating an example of the method for manufacturing the radiation detector according to the embodiment of the technology of the present disclosure.

Then, the support member 60 is attached to the second surface S2 of the substrate 34 which is opposite to the first surface S1 (FIG. 6B).

Figure 6C:
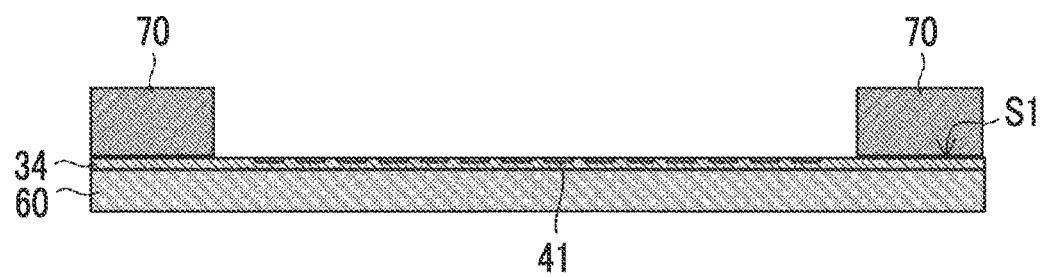
FIG. 6C is a cross-sectional view illustrating an example of the method for manufacturing the radiation detector according to the embodiment of the technology of the present disclosure.
Figure 7:
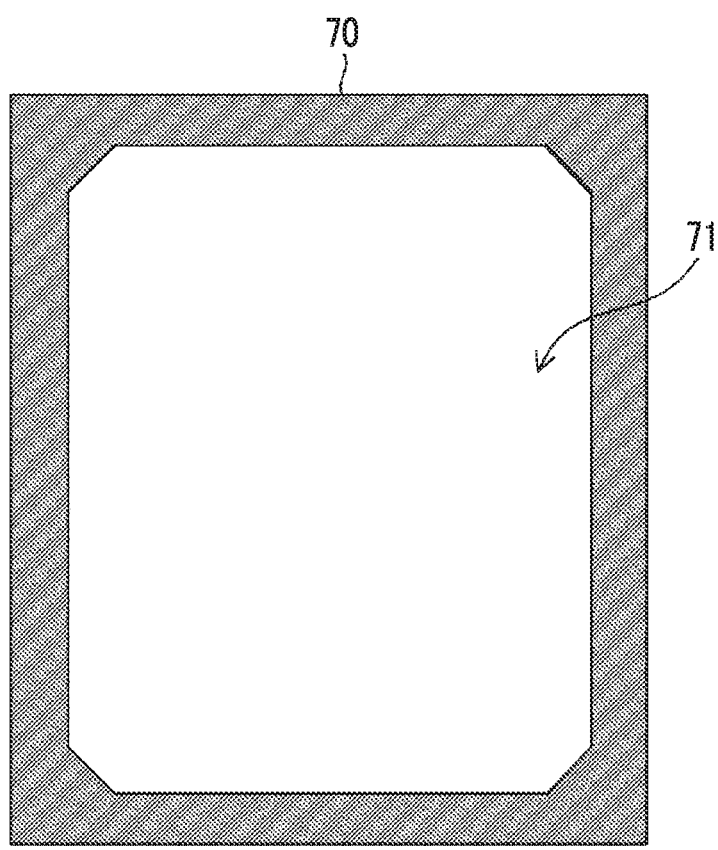
FIG. 7 is a plan view illustrating a mask used to form a scintillator according to the embodiment of the technology of the present disclosure.

Then, a mask 70 is formed on the first surface S1 of the substrate 34 (FIG. 6C). Here, FIG. 7 is a plan view illustrating an example of the configuration of the mask 70. As illustrated in FIG. 7, the mask 70 has an opening portion 71 with a shape corresponding to the outer shape of the scintillator 32 that is formed in the subsequent process.

Figure 6D:
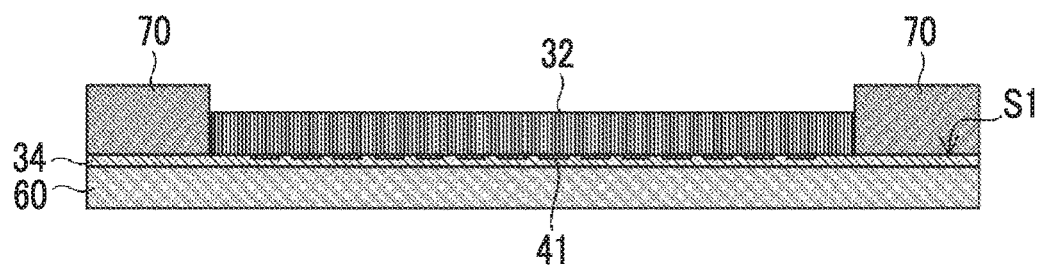
FIG. 6D is a cross-sectional view illustrating an example of the method for manufacturing the radiation detector according to the embodiment of the technology of the present disclosure.

Then, the scintillator 32 is formed in a portion of the first surface S1 of the substrate 34 which is exposed through the opening portion 71 of the mask 70 (FIG. 6D). The scintillator 32 can be formed by directly growing the columnar crystal of CsI doped with Tl on the substrate 34 using, for example, a vapor growth method. In a case in which the mask 70 is used to form the scintillator 32, the outer shape of the scintillator 32 corresponds to the shape of the opening portion 71 of the mask 70. That is, each of the corners $32C_1$ to $32C_4$ of the scintillator is chamfered. As illustrated in FIG. 4, for example, the outer edge 32E of the corner $32C_1$ of the scintillator 32 is disposed closer to the inside (center) of the substrate 34 than the extension line 32b of the side $32L_1$ and the side $32L_2$ sharing the corner $32C_1$. After the scintillator 32 is formed, the mask 70 is removed.

Figure 6E:
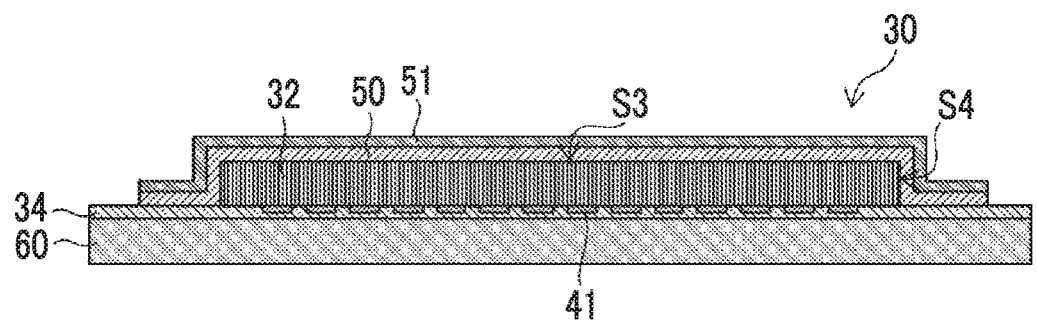
FIG. 6E is a cross-sectional view illustrating an example of the method for manufacturing the radiation detector according to the embodiment of the technology of the present disclosure.

Then, the reflective film 50 is formed so as to cover the surface S3 of the scintillator 32 which is opposite to the contact surface with the substrate 34 and the surface S4 intersecting the surface S3. Then, the sealing film 51 covering the reflective film 50 is formed (FIG. 6E). A stacked film including the reflective film 50 and the sealing film 51 is formed so as to cover the substrate 34 in the periphery of the scintillator 32.

In a case in which the substrate has flexibility and is handled in, for example, the process of manufacturing the radiation detector, the substrate is likely to warp and the scintillator is likely to peel off from the substrate. In particular, since the corners of the scintillator have a smaller contact area with the substrate than the other portions of the scintillator, peeling is likely to occur at the corners. According to the radiation detector 30 and the radiography apparatus 10 of the embodiment of the technology of the present disclosure, each of the corners $32C_1$ to $32C_4$ of the scintillator 32 is chamfered and the outer edge 32E of each of the corners $32C_1$ to $32C_4$ is disposed closer to the inside (center) of the substrate 34 than the extension line of each of the sides sharing the corners $32C_1$ to $32C_4$. Therefore, it is possible to increase the contact area of the scintillator 32 with the substrate 34 at each of the corners $32C_1$ to $32C_4$ and to reduce the risk of the scintillator 32 peeling off from the substrate 34, as compared to a case in which the outer edge of each of the corners $32C_1$ to $32C_4$ of the scintillator 32 is disposed on the extension line of each of the sides sharing the corners $32C_1$ to $32C_4$ or is disposed closer to the outside of the substrate than the extension line.

In addition, since each of the corners $32C_1$ to $32C_4$ of the scintillator 32 is chamfered, it is possible to suppress the occurrence of the breakage of the stacked film including the reflective film 50 and the sealing film 51 in a portion covering the corners $32C_1$ to $32C_4$ of the scintillator 32 as compared to a case in which the corners are not chamfered. Further, it is possible to increase the contact area of the stacked film including the reflective film 50 and the sealing film 51 with the substrate 34 in the vicinity of the corners $32C_1$ to $32C_4$ of the scintillator 32. Therefore, it is possible to suppress the risk that the stacked film including the reflective film 50 and the sealing film 51 will peel off from the scintillator 32 and to suppress the occurrence of damage such as the breakage of the stacked film.

Figure 8:
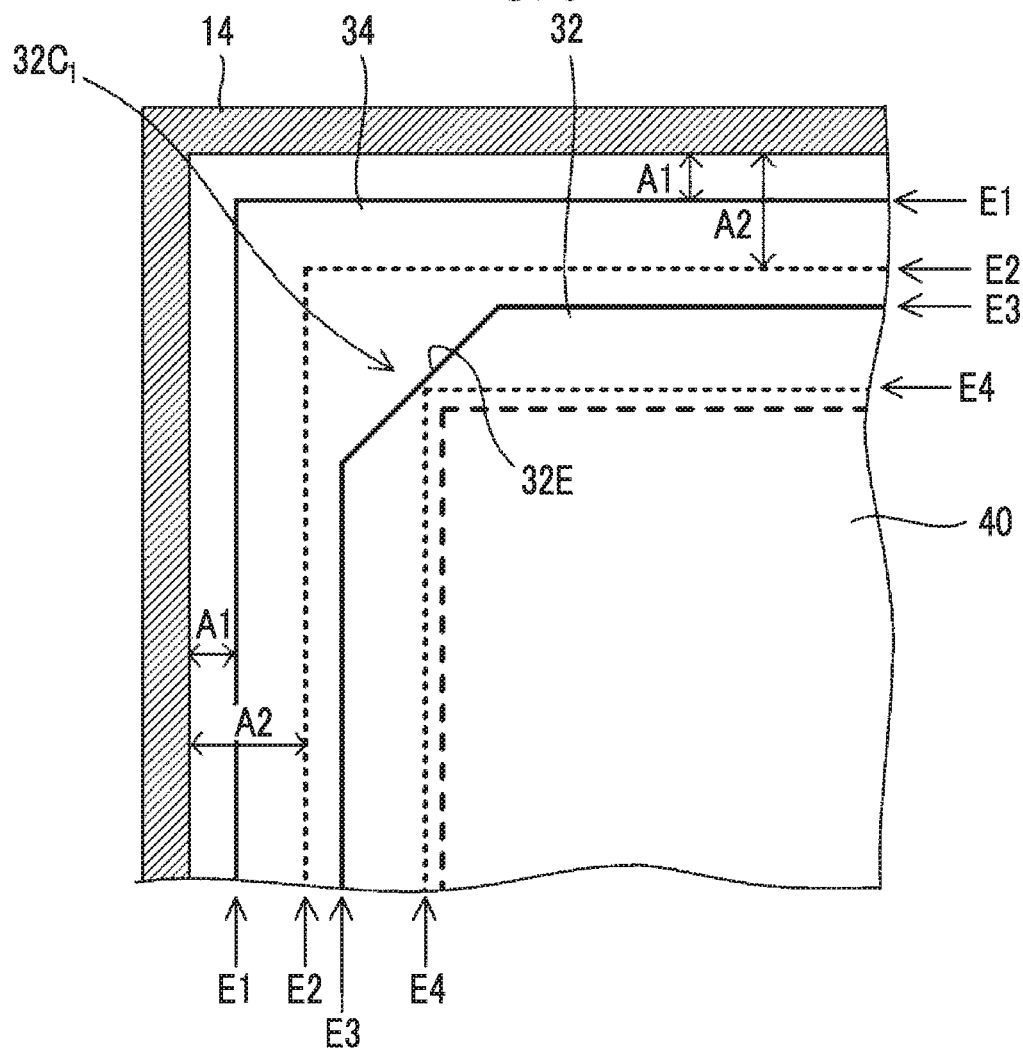
FIG. 8 is a plan view illustrating an example of the configuration of the radiography apparatus according to the embodiment of the technology of the present disclosure.

Here, FIG. 8 is a diagram illustrating an outer edge E2 of a substrate and an outer edge E4 of a scintillator in a case in which a glass substrate without flexibility is used as the substrate, and the outer edge E1 of the substrate 34 and the outer edge E3 of the scintillator 32 according to the embodiment of the technology of the present disclosure. According to the radiography apparatus 10 of the embodiment of the technology of the present disclosure, since the substrate 34 is made of a flexible material, such as a resin film, the clearance A1 between the substrate 34 and the housing 14 can be less than a clearance A2 in the case in which the glass substrate is used. The size of the substrate 34 according to the embodiment of the technology of the present disclosure can be larger than the size of the glass substrate. Therefore, the size of the scintillator 32 according to the embodiment of the technology of the present disclosure can be larger than the size of the scintillator in the case in which the glass substrate is used. Therefore, according to the radiation detector 30 and the radiography apparatus 10 of the embodiment of the technology of the present disclosure, even in a case in which the corners $32C_1$ to $32C_4$ of the scintillator 32 are chamfered, the entire active area 40 can be covered with the scintillator 32. As a result, it is possible to make each of the plurality of pixels 41 function effectively and all of the radiography images obtained by the radiography apparatus 10 can have high quality.

Figure 9:
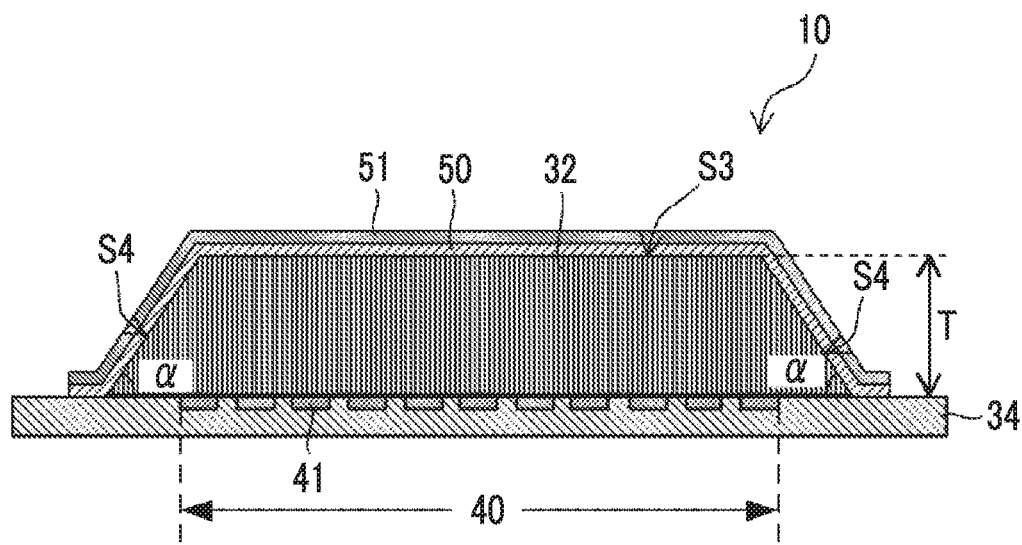
FIG. 9 is a cross-sectional view illustrating an example of the configuration of the radiation detector according to the embodiment of the technology of the present disclosure.

FIG. 9 is a cross-sectional view illustrating the radiation detector 30 according to the embodiment of the technology of the present disclosure. In a case in which the scintillator 32 is formed by a vapor growth method, the surface S4 of the end of the scintillator 32 is an inclined surface as illustrated in FIG. 9. As described above, according to the radiation detector 30 of the embodiment of the technology of the present disclosure, the size of the substrate 34 can be larger than that in the case in which the glass substrate is used. Therefore, an inclination angle $\alpha$ of the surface S4 of the scintillator 32 can be less than that in the case in which the glass substrate is used. As a result, it is possible to reduce the accuracy of the alignment between the stacked film including the reflective film 50 and the sealing film 51 and the scintillator 32 in a case in which the stacked film is formed on the surface of the scintillator 32, as compared to the case in which the glass substrate is used.

As illustrated in FIG. 9, the pixel 41 may be disposed at a position overlapping the inclined surface S4 of the scintillator 32. In this case, it is preferable that the thickness of an inclined portion of the scintillator 32 which covers the pixel 41 is equal to or greater than 70% of the thickness T of a flat portion of the scintillator 32. As a result, it is possible to make each of the plurality of pixels 41 function effectively and all of the radiography images obtained by the radiography apparatus 10 can have high quality.

In the above-described embodiment, the case in which the scintillator 32 is directly grown on the substrate 34 by the vapor growth method has been described as an example. However, the present disclosure is not limited to this aspect. For example, the scintillator 32 formed on a substrate different from the substrate 34 by the vapor growth method may be attached to the substrate 34. In this case, a mask that has an opening portion with a shape corresponding to the outer shape of the scintillator 32 is disposed on a substrate different from the substrate 34 and the columnar crystal of CsI:Tl is grown on a portion of the different substrate which is exposed through the opening portion of the mask to form the scintillator 32 on the substrate. Then, the scintillator 32 formed on the substrate is attached to the substrate 34.

Figure 10A:
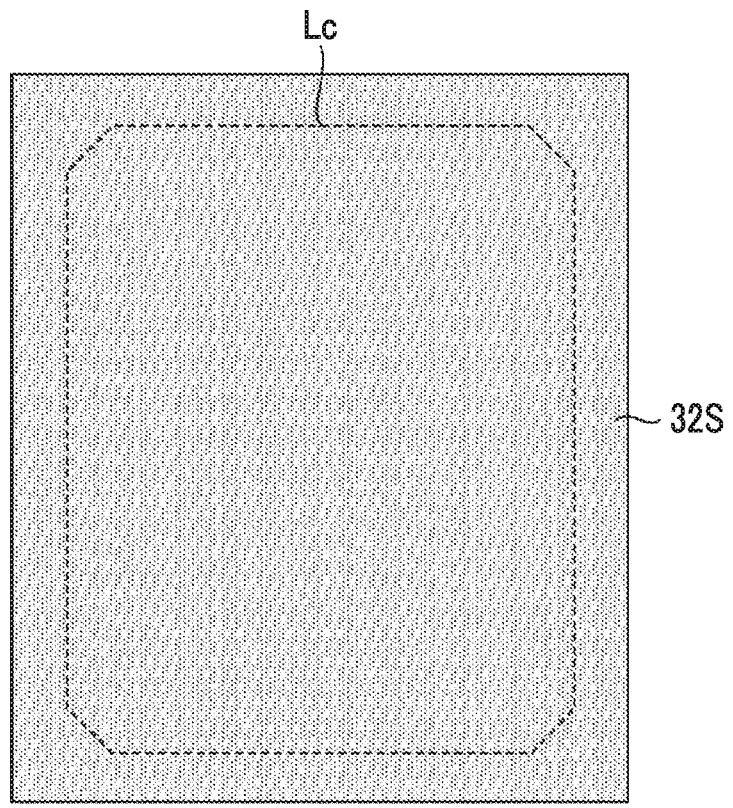
FIG. 10A is a plan view illustrating a scintillator sheet according to the embodiment of the technology of the present disclosure.
Figure 10B:
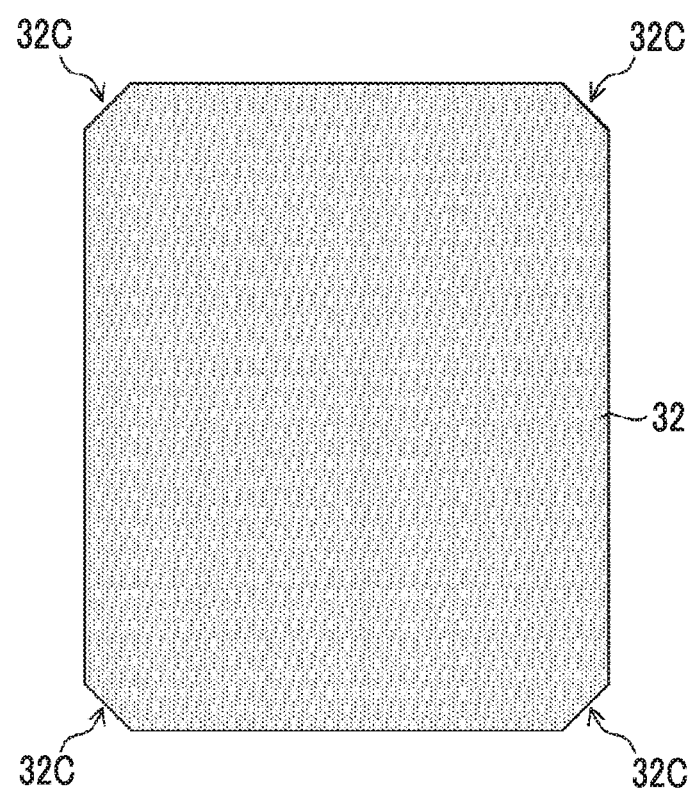
FIG. 10B is a plan view illustrating the scintillator obtained by cutting the scintillator sheet according to the embodiment of the technology of the present disclosure.

In general, a scintillator that is made of a material without having a columnar crystal structure, such as $Gd_2O_2S$:Tb, is provided in the state of a scintillator sheet. In a case in which a scintillator sheet is used as the material forming the scintillator 32, as illustrated in FIG. 10A, a scintillator sheet 32S is cut along a cutting line Lc corresponding to the outer shape of the scintillator 32. As a result, as illustrated in FIG. 10B, the scintillator 32 with the chamfered corners $32C_1$ to $32C_4$ is cut out from the scintillator sheet 32S. Then, the scintillator 32 cut out from the scintillator sheet 32S is attached to the substrate 34.

Figure 11A:
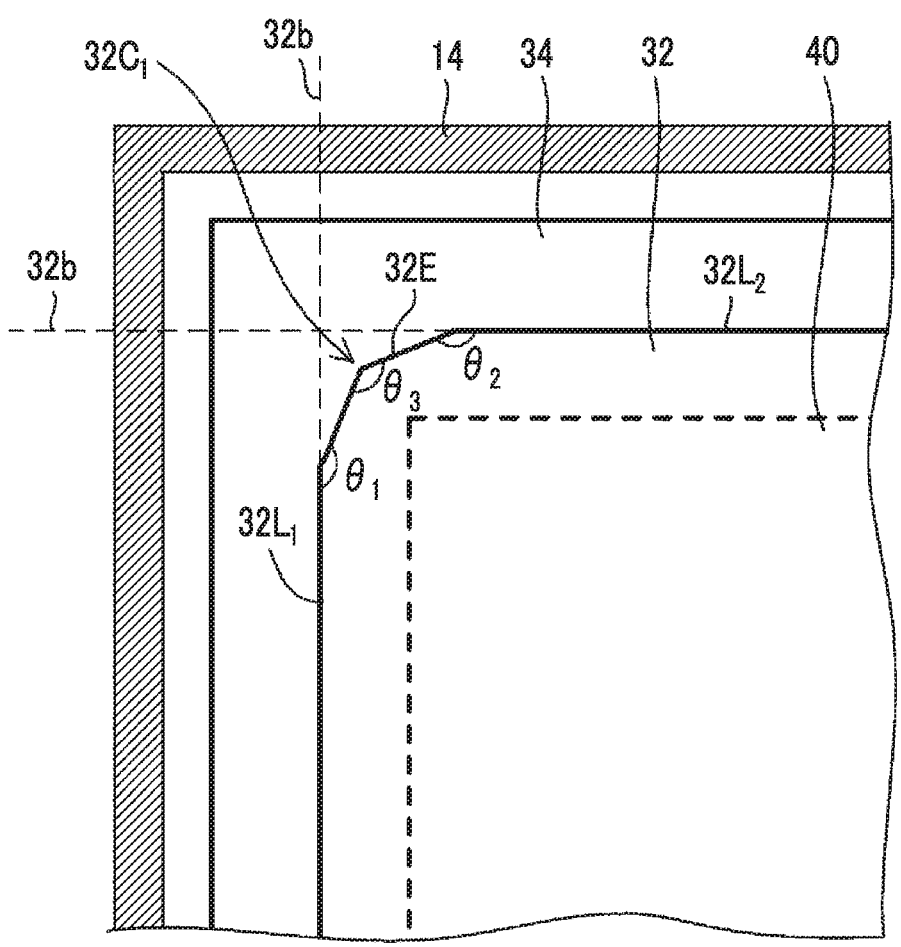
FIG. 11A is a plan view illustrating an example of a partial configuration of the radiography apparatus according to the embodiment of the technology of the present disclosure.

In the above-described embodiment, each of the corners $32C_1$ to $32C_4$ of the scintillator 32 is chamfered such that the outer edge 32E of each of the corners $32C_1$ to $32C_4$ of the scintillator 32 includes one side which extends in a direction intersecting each of the sides sharing the corner. However, the present disclosure is not limited to this aspect. For example, as illustrated in FIG. 11A, the outer edge 32E of each of the corners $32C_1$ to $32C_4$ of the scintillator 32 may have two sides which extend in directions intersecting each of the sides sharing the corner. Further, the outer edge 32E of each of the corners $32C_1$ to $32C_4$ of the scintillator 32 may have three or more sides which extend in directions intersecting each of the sides sharing the corner. Since the outer edge 32E of each of the corners $32C_1$ to $32C_4$ of the scintillator 32 has at least one side which intersects each of the sides sharing the corner, the scintillator 32 can come into contact with the substrate 34 on the at least one side and it is possible to promote the effect of reducing the risk of the scintillator 32 peeling off from the substrate 34.

Figure 11B:
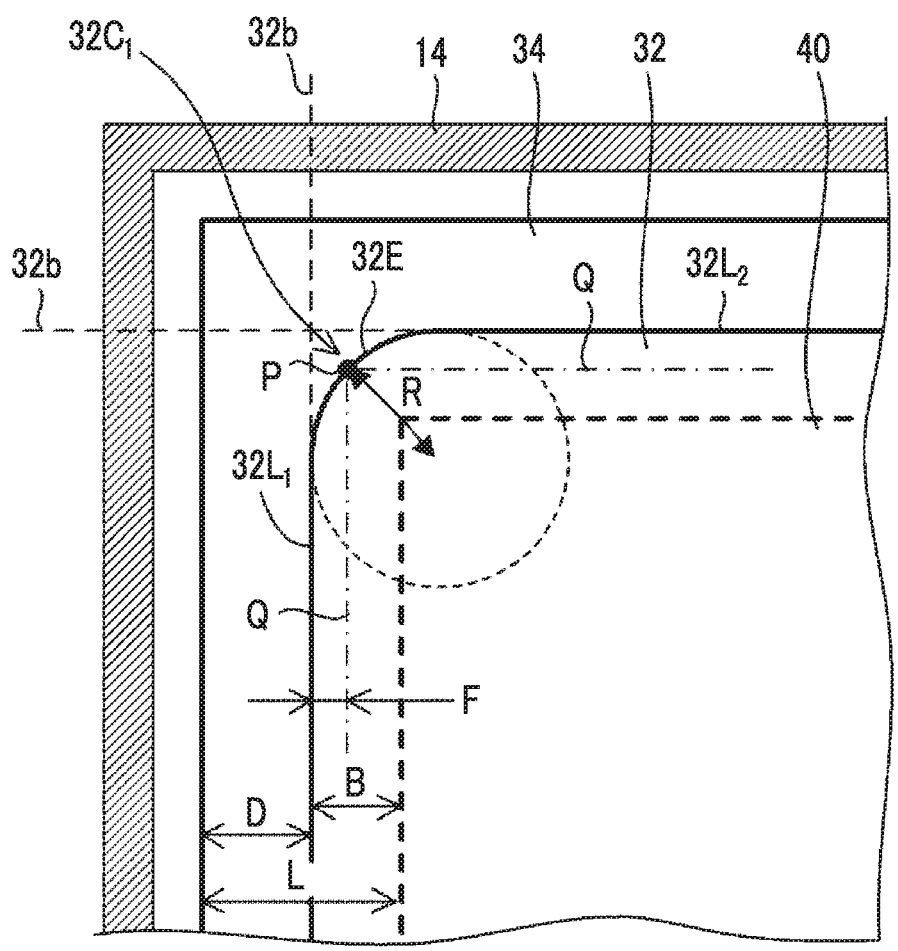
FIG. 11B is a plan view illustrating an example of the partial configuration of the radiography apparatus according to the embodiment of the technology of the present disclosure.

Further, as illustrated in FIG. 11B, the outer edges 32E of the corners $32C_1$ to $32C_4$ of the scintillator 32 may have a rounded shape. In this case, the outer edge 32E may have a shape corresponding to the arc of a circle or an ellipse or may have a curved shape other than a circle or an ellipse. In a case in which the outer edge 32E of each of the corners $32C_1$ to $32C_4$ of the scintillator 32 is formed in a rounded shape, the scintillator 32 can come into contact with the substrate 34 at the rounded edge 32E and it is possible to promote the effect of reducing the risk of the scintillator 32 peeling off from the substrate 34.

Here, the distance between the end of the active area 40 and the corresponding side of the scintillator 32 is B, the distance between each of the sides $32L_1$ to $32L_4$ of the scintillator 32 and the corresponding side of the substrate 34 is D, and the distance between the end of the active area 40 and the housing 14 is L, it is preferable to that the following Expression (4) is satisfied. The following Expression (4) means that the clearance between the substrate 34 and the housing 14 is greater than zero.

$$L-B-D>0 \qquad (4)$$

Further, in a case in which the curvature radius of the outer edge 32E of each of the corners $32C_1$ to $32C_4$ of the scintillator 32 is R, a distance F between an imaginary line Q that passes through the apex P of each of the corners $32C_1$ to $32C_4$ of the scintillator 32 and is parallel to the end of the active area 40 and each of the sides $32L_1$ to $32L_4$ of the scintillator is represented by the following Expression (5). In addition, since B>F is satisfied, Expression (6) can be derived. Furthermore, Expression (7) can be derived from Expressions (4) and (6).

$$F=R-R/\sqrt{2} \qquad (5)$$

$$B>R-R/\sqrt{2} \qquad (6)$$

$$R<(2+\sqrt{2})B<(2+\sqrt{2})\times(L-D) \qquad (7)$$

In each of the aspects illustrated in FIGS. 11A and 11B, the outer edge 32E of each of the corners $32C_1$ to $32C_4$ of the scintillator 32 is disposed closer to the inside (center) of the substrate 34 than the extension line of each of the sides sharing the corner. Therefore, it is possible to reduce the risk of the scintillator peeling off from the substrate, as compared to a case in which the technology of the present disclosure is not applied.

All of the documents, patent applications, and technical standards described in the specification are incorporated in the specification by reference to the same extent as each document, patent application, and technical standard are specifically and individually noted to be incorporated by reference.

According to a second aspect of the technology of the present disclosure, in the radiation detector, each of the corners of the scintillator is chamfered.

According to a third aspect of the technology of the present disclosure, in the radiation detector, the outer edge of each of the corners of the scintillator has at least one side that intersects each of the sides sharing the corner.

According to a fourth aspect of the technology of the present disclosure, in the radiation detector, the outer edge of each of the corners of the scintillator has a rounded shape.

According to a fifth aspect of the technology of the present disclosure, in the radiation detector, the scintillator covers each of the plurality of pixels.

According to a sixth aspect of the technology of the present disclosure, there is provided a radiography apparatus comprising: the radiation detector according to any one of the first to fifth aspects; a reading unit that reads out charge which has been generated by each of the photoelectric conversion elements and accumulated in each of the plurality of pixels; and a generation unit that generates image data on the basis of the charge read out from each of the plurality of pixels.

According to an eighth aspect of the technology of the present disclosure, in the manufacturing method, the step of stacking the scintillator on the substrate comprises: a step of disposing a mask having an opening portion with a shape corresponding to an outer shape of the scintillator on the substrate; and a step of depositing a material forming the scintillator on a portion of the substrate which is exposed through the opening portion.

According to a ninth aspect of the technology of the present disclosure, in the manufacturing method, the step of stacking the scintillator on the substrate comprises: a step of disposing a mask having an opening portion with a shape corresponding to an outer shape of the scintillator on a substrate different from the substrate; a step of depositing a material forming the scintillator on a portion of the different substrate which is exposed through the opening portion to obtain the scintillator; and a step of attaching the scintillator formed on the different substrate to the substrate.

According to a tenth aspect of the technology of the present disclosure, in the manufacturing method, the step of stacking the scintillator on the substrate comprises: a step of processing a scintillator sheet into a shape corresponding to an outer shape of the scintillator to obtain the scintillator; and a step of attaching the scintillator obtained by processing the scintillator sheet to the substrate.

According to the first aspect of the technology of the present disclosure, it is possible to reduce the risk of the scintillator peeling off from the substrate, as compared to a case in which the outer edge of each of the corners of the scintillator is disposed on an extension line of each of the sides sharing the corner or is disposed closer to the outside of the substrate than the extension line.

According to the second aspect of the technology of the present disclosure, it is possible to promote the effect of reducing the risk of the scintillator peeling off from the substrate.

According to the third aspect of the technology of the present disclosure, it is possible to promote the effect of reducing the risk of the scintillator peeling off from the substrate.

According to the fourth aspect of the technology of the present disclosure, it is possible to promote the effect of reducing the risk of the scintillator peeling off from the substrate.

According to the fifth aspect of the technology of the present disclosure, it is possible to make each of the plurality of pixels function effectively.

According to the sixth aspect of the technology of the present disclosure, it is possible to reduce the risk of the scintillator peeling off from the substrate.

According to the seventh aspect of the technology of the present disclosure, it is possible to reduce the risk of the scintillator peeling off from the substrate, as compared to the case in which the outer edge of each of the corners of the scintillator is disposed on the extension line of each of the sides sharing the corner or is disposed closer to the outside of the substrate than the extension line.

The manufacturing method according to the eighth aspect of the technology of the present disclosure can be applied to, for example, a case in which a scintillator is directly formed on a substrate by a vapor growth method.

The manufacturing method according to the ninth aspect of the technology of the present disclosure can be applied to, for example, a case in which a scintillator formed on another substrate by the vapor growth method is used.

The manufacturing method according to the tenth aspect of the technology of the present disclosure can be applied to, for example, in a case in which a scintillator sheet is used.

What is claimed is:

1. A radiation detector comprising:
a substrate having flexibility;
a plurality of pixels which are provided on a surface of the substrate and each of which includes a photoelectric conversion element; and
a scintillator that is stacked on the substrate and has a plurality of corners,
wherein an outer edge of each of the corners of the scintillator is disposed closer to an inside of the substrate than an extension line of each of sides sharing the corner, and
the scintillator covers each of the plurality of pixels.

2. The radiation detector according to claim 1,
wherein each of the corners of the scintillator is chamfered.

3. The radiation detector according to claim 2,
wherein the outer edge of each of the corners of the scintillator has at least one side that intersects each of the sides sharing the corner.

4. The radiation detector according to claim 2,
wherein the outer edge of each of the corners of the scintillator has a rounded shape.

5. A radiography apparatus comprising:
the radiation detector according to claim 2;
a reading circuit that reads out charge which has been generated by each of the photoelectric conversion elements and accumulated in each of the plurality of pixels; and a generation circuit that generates image data on the basis of the charge read out from each of the plurality of pixels.

6. The radiation detector according to claim 1,
wherein the outer edge of each of the corners of the scintillator has at least one side that intersects each of the sides sharing the corner.

7. The radiation detector according to claim 1,
wherein the outer edge of each of the corners of the scintillator has a rounded shape.

8. A radiography apparatus comprising:
the radiation detector according to claim 1;
a reading circuit that reads out charge which has been generated by each of the photoelectric conversion elements and accumulated in each of the plurality of pixels; and
a generation circuit that generates image data on the basis of the charge read out from each of the plurality of pixels.

9. A method for manufacturing a radiation detector, the method comprising:
forming a plurality of pixels each of which includes a photoelectric conversion element on a surface of a substrate having flexibility; and
stacking a scintillator which has a plurality of corners and in which an outer edge of each of the corners is disposed closer to an inside of the substrate than an extension line of each of sides sharing the corner such that the scintillator covers each of the plurality of pixels.

10. The manufacturing method according to claim 9,
wherein stacking the scintillator on the substrate comprises:
disposing a mask having an opening portion with a shape corresponding to an outer shape of the scintillator on the substrate; and
depositing a material forming the scintillator on a portion of the substrate which is exposed through the opening portion.

11. The manufacturing method according to claim 9,
wherein stacking the scintillator on the substrate comprises:
disposing a mask having an opening portion with a shape corresponding to an outer shape of the scintillator on a substrate different from the substrate;
depositing a material forming the scintillator on a portion of the different substrate which is exposed through the opening portion to obtain the scintillator; and
attaching the scintillator formed on the different substrate to the substrate.

12. The manufacturing method according to claim 9,
wherein stacking the scintillator on the substrate comprises:
processing a scintillator sheet into a shape corresponding to an outer shape of the scintillator to obtain the scintillator; and
attaching the scintillator obtained by processing the scintillator sheet to the substrate.

* * * * *